United States Patent
Huang et al.

(10) Patent No.: US 8,674,964 B2
(45) Date of Patent: Mar. 18, 2014

(54) ORGANIC LIGHT EMITTING DIODE TOUCH DISPLAY

(75) Inventors: Jung-yen Huang, Hsin-Chu (TW); An-thung Cho, Hsin-Chu (TW); Shih-feng Hsu, Hsin-Chu (TW); Wei-pang Huang, Hsin-Chu (TW); Chia-tien Peng, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 727 days.

(21) Appl. No.: 12/830,253

(22) Filed: Jul. 2, 2010
(Under 37 CFR 1.47)

(65) Prior Publication Data
US 2011/0043487 A1    Feb. 24, 2011

(30) Foreign Application Priority Data

Jul. 2, 2009 (TW) ............................ 98122480 A
Jul. 2, 2010 (TW) ............................ 99121792 A

(51) Int. Cl.
*G06F 3/042* (2006.01)

(52) U.S. Cl.
USPC ........................................... 345/175

(58) Field of Classification Search
USPC ......... 345/76–83, 173–183; 178/18.01–18.11
See application file for complete search history.

(56) References Cited

U.S. PATENT DOCUMENTS

| | | | |
|---|---|---|---|
| 7,230,608 B2 | 6/2007 | Cok | |
| 2007/0040770 A1 | 2/2007 | Kim | |
| 2008/0036711 A1* | 2/2008 | Kwak et al. | 345/82 |
| 2008/0074401 A1 | 3/2008 | Chung et al. | |
| 2008/0121442 A1* | 5/2008 | Boer et al. | 178/18.09 |
| 2008/0122792 A1* | 5/2008 | Izadi et al. | 345/173 |
| 2008/0122803 A1* | 5/2008 | Izadi et al. | 345/175 |
| 2008/0297487 A1* | 12/2008 | Hotelling et al. | 345/173 |
| 2009/0027358 A1* | 1/2009 | hosono | 345/175 |
| 2009/0128508 A1* | 5/2009 | Sohn et al. | 345/173 |
| 2009/0143109 A1* | 6/2009 | Yamazaki | 455/566 |
| 2009/0295760 A1* | 12/2009 | Linge et al. | 345/179 |
| 2011/0096009 A1* | 4/2011 | Kurokawa et al. | 345/173 |

FOREIGN PATENT DOCUMENTS

| | | |
|---|---|---|
| CN | 1917015 | 2/2007 |
| CN | 101153972 | 4/2008 |

* cited by examiner

*Primary Examiner* — Rodney Amadiz

(57) ABSTRACT

An OLED display is proposed. The OLED display includes a gate driver for generating a scanning signal, a source driver for generating a data signal, and a plurality of cells arranged in an array. Each cell includes a first transistor for delivering the data signal when receiving the scanning signal, a second transistor for generating a driving current based on a voltage difference between a first supply voltage signal and the data signal, a storage capacitor coupled between the first transistor and an output end of the driving circuit, for storing the data signal, an organic light emitting diode for generating light based on the driving current, an infrared emitting layer for producing infrared ray, and an infrared sensitive layer for sensing the infrared ray reflected by an object.

18 Claims, 4 Drawing Sheets

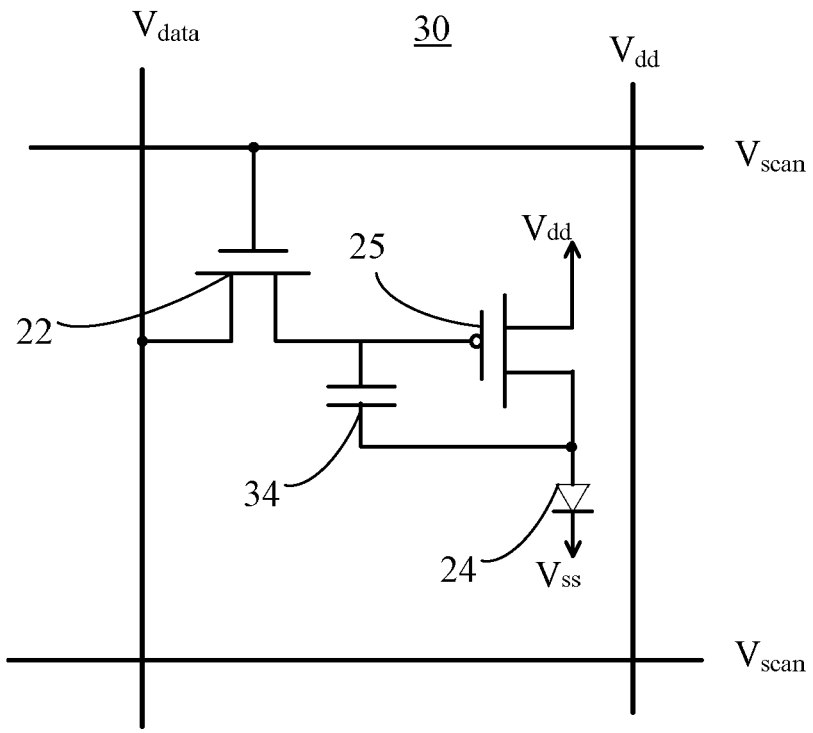
FIG. 2A
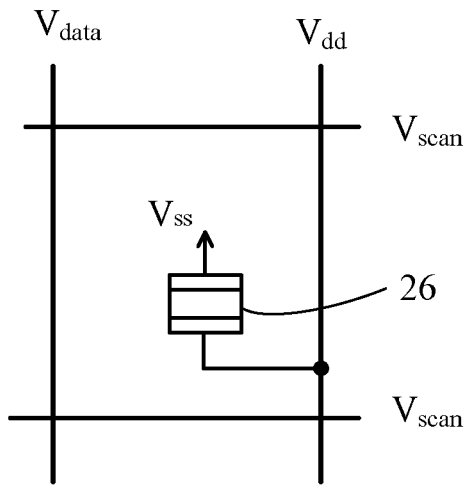 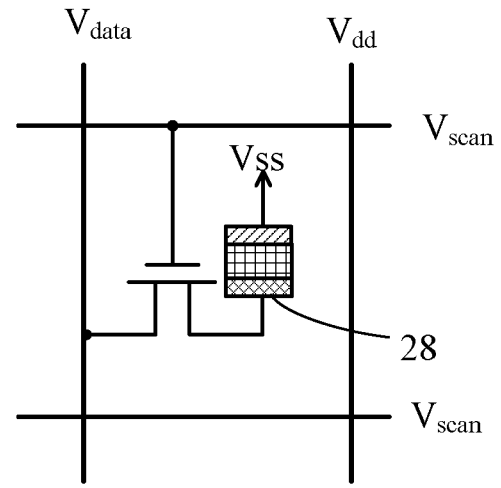
FIG. 2B  FIG. 2C

ORGANIC LIGHT EMITTING DIODE TOUCH DISPLAY

BACKGROUND OF THE INVENTION

1. Claim of Priority

The present application claims priority to Taiwanese Patent Application No. 098122480 filed on Jul. 2, 2009 and Taiwanese Patent Application No. 099121792 filed on Jul. 2, 2010.

2. Field of the Invention

The present invention relates to an organic light emitting diode (OLED) display, and more particularly, to an organic light emitting diode touch display.

3. Description of the Related Art

With a rapid development of monitor types, novel and colorful monitors with high resolution, e.g., organic light emitting diode (OLED) displays, are indispensable components used in various electronic products such as monitors for notebook computers, personal digital assistants (PDAs), digital cameras, and projectors. The demand for the novelty and colorful monitors has increased tremendously.

Luminous intensity of organic light emitting diode displays is determined by forward bias current of a light emitting diode (LED), differing from traditional liquid crystal displays (LCDs) on the market employing the voltage applied on liquid crystal pixels to determine pixel luminance. Deploying a self-illuminating technology, OLED displays do not require backlight, and further they can provide faster response time than LCDs do. Besides, OLED displays still have advantages, such as a better contrast ratio and a broader visual angle.

In order to facilitate carrying and utilizing OLED displays, OLED touch display panels that users can touch directly have become one of the tendencies of market development. Traditionally, OLED resistance or capacity touch panels, upon which additional resistance or capacity devices are placed, judge position coordinates of touch points by detecting voltage variations in the touch points. However, components, such as resistance devices and capacity devices, are placed on a panel directly, so it results in a decrease in light transmittance of OLED panels and an increase in total thickness of the panel. As for optical touch panels, they are OLED panels that are encircled with a large quantity of light sources and corresponding optical sensing devices, which are utilized to detect light of the corresponding light sources to judge position coordinates of touch points. Optical touch panels are divided into two sensing types: optical shadow type and optical reflective type.

The optical shadow type indicates that, under operational conditions of abundant ambient light, an optical touch panel is judged whether or not to be touched depending upon variations in ambient light. For example, when an object (e.g., a finger, a touch pad pencil, etc.) touches a pixel in one bright space, the light sensor of the touched pixel senses lower environmental brightness than that of the untouched pixels does. An OLED display system concludes that a pixel sensing lower light brightness is touched and other pixels with higher light brightness is untouched.

The optical reflective type indicates that, under operational conditions of dim environment, an optical touch panel is detected whether or not to be touched depending upon variations in reflected light of an OLED backlight. For example, in one gloomy space where backlight brightness is higher than environmental brightness at this time, when an object (e.g., a finger, a touch pad pencil, etc.) touches a pixel, the light sensor of the touched pixel senses higher light brightness than that of the untouched pixels does, for light from the backlight is reflected to the light sensor of the touched pixel via the object. An OLED display system concludes that a pixel sensing higher light brightness is touched and other pixels with lower light brightness is untouched.

However, light produced by the backlight is quite weak after being reflected, so under conditions of dim environment the signals that are sensed by the light sensor are usually weak, and signal recognition is less accurate as well. Moreover, if images, surrounding the zone that needs touching being at lower gray level (e.g., black), are intended to be dragged, it is easier to result in being unable to sense because of lack of light quantity of pixels.

SUMMARY OF THE INVENTION

It is therefore an object of the present invention to provide a touch organic light emitting diode (OLED) display, into which an infrared emitting layer, an infrared sensing unit, and an organic light emitting diode are integrated. In the optical reflective type, the OLED display adopts the detection of the amount of infrared rays to determine whether or not a pixel is touched in order to solve the problems occurred in prior art.

According to the present invention, an OLED display is proposed. The OLED display comprises a gate driver, a source driver, a plurality of pixel units, and a plurality of infrared units. The gate driver is used for providing a plurality of scanning signals. The source driver is used for providing a plurality of data signals. Each pixel unit comprises a first transistor for delivering the data signal when receiving the scanning signal; a driving circuit coupled to the first transistor for generating a driving current based on a voltage difference between a first supply voltage signal and the data signal; a storage capacitor coupled to the driving circuit, for storing the data signal; and an organic light emitting diode for generating light based on the driving current. Each infrared unit comprises an infrared emitting region for producing infrared ray, and an infrared sensitive region for sensing the infrared ray reflected by an object.

In one aspect of the present invention, the organic light emitting diode display further comprises a processing unit for determining a position which the object contacts the pixel units based on the infrared ray sensed by the infrared sensitive layer.

In another aspect of the present invention, the infrared emitting layer is used for generating the infrared ray in response to the first supply voltage signal.

In another aspect of the present invention, the OLED display further comprises a detection unit for enabling the first supply voltage signal when brightness of the ambient light organic light emitting diode display is lower than a threshold.

In another aspect of the present invention, each pixel unit further comprises a power-electrode metallic layer for conducting the first supply voltage signal; a display anode disposed on the power-electrode metallic layer; an infrared emitting layer disposed on the display anode; and a cathode metal layer disposed over the infrared emitting layer.

In another aspect of the present invention, the infrared emitting layer is made of a material which is similar to the organic light emitting diode.

In still another aspect of the present invention, the infrared sensitive layer includes a silicon rich sensor, a P-I-N sensor, or an a-Si TFT sensor.

The present invention will be described with reference to the accompanying drawings, which show exemplary embodiments of the present invention.

BRIEF DESCRIPTION OF THE DRAWINGS

FIG. 2A illustrates an equivalent circuit diagram of the display unit in FIG. 1 according to a first embodiment of the present invention.

FIG. 2B shows an equivalent circuit diagram of an infrared emitting region of the IR area in FIG. 1.

FIG. 2C demonstrates an equivalent circuit diagram of an infrared sensitive region of the IR area in FIG. 1.

DETAILED DESCRIPTION OF THE PREFERRED EMBODIMENT

Figure 1:
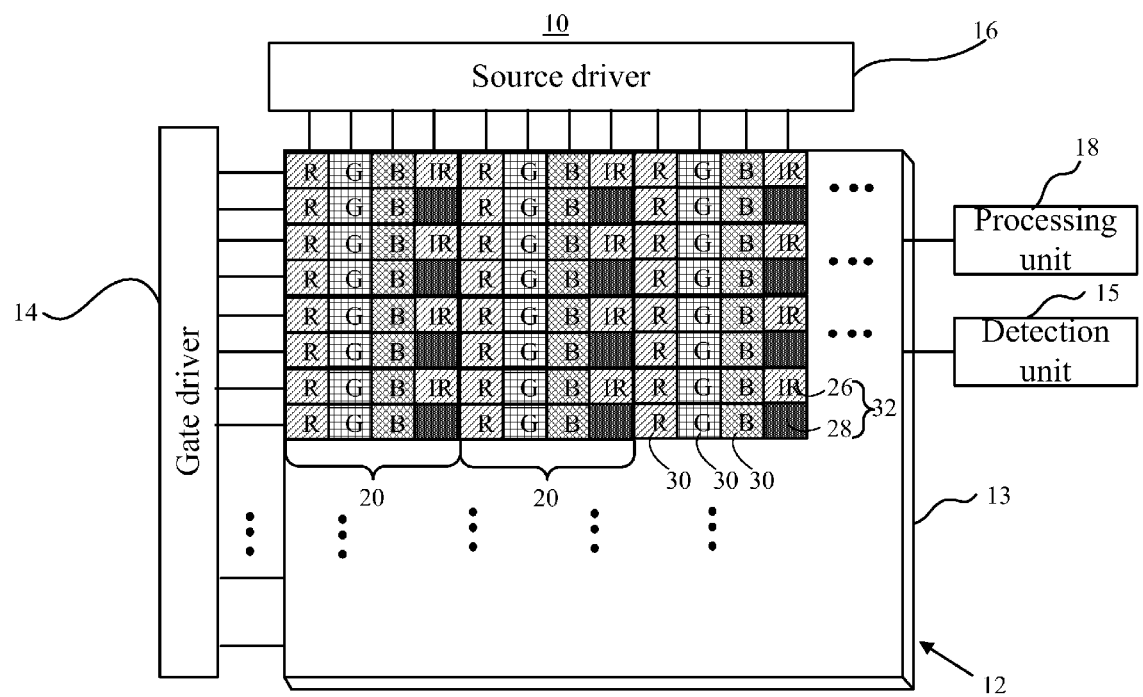
FIG. 1 shows a functional block diagram of an OLED display according to a preferred embodiment of the present invention.

Referring to FIG. 1 showing a diagram of an OLED display 10 according to a preferred embodiment of the present invention, the OLED display 10 comprises an OLED panel 12, a gate driver 14, a source driver 16, a processing unit 18, and a detection unit 15. The OLED panel 12 comprises a substrate 13 having a display region formed by a plurality of pixel units 30, which represents the three primary colors—red, green, and blue (RGB)—respectively, and a plurality of infrared (IR) units 32. The IR unit 32 comprises an infrared emitting region 26 and an infrared sensitive region 28. The infrared emitting region 26 is employed to emit infrared rays, and the infrared sensitive region 28 is utilized to sense the infrared rays reflected from an object. As shown in FIG. 1, at least six pixel units 30 are arranged with one infrared unit 32.

Referring to FIGS. 2A, 2B, and 2C, FIG. 2A illustrates an equivalent circuit diagram of the pixel unit 30 in FIG. 1 according to a first embodiment of the present invention, FIG. 2B shows an equivalent circuit diagram of an infrared emitting region 26 of the IR unit 32 in FIG. 1, and FIG. 2C demonstrates an equivalent circuit diagram of an infrared sensitive region 28 of the IR unit 32 in FIG. 1. In the first embodiment, each pixel unit 30 comprises a first transistor 22, an organic light emitting diode 24, a storage capacitor 34, and a driving circuit (i.e. a second transistor 25). The first transistor 22 comprises an input end coupled to a data line, a control end coupled to a scan line, and an output end coupled to a control end of the second transistor 25. The second transistor 25 comprises an input end coupled to a first supply voltage signal $V_{dd}$, and an output end coupled to the OLED 24. The first transistor 22 receives scanning signals $V_{scan}$ from the gate driver 14 and then conducts data signals $V_{data}$ from the source driver 16. Meanwhile, the second transistor 25 produces current based on voltage difference between the first supply voltage signal $V_{dd}$ and the data signal $V_{data}$. The organic light emitting diode 24 emits the three primary colors of light (red, green, and blue) depending upon the current flowing through the second transistor 25, and then adjusts the proportion of the three primary colors of light to produce different gray levels based on data signals $V_{data}$. The storage capacitor 34 is coupled between the organic light emitting diode 24 and the control end of the second transistor 25.

The storage capacitor 34 stores data signals $V_{data}$, so that the pixel unit 30 remains required gray levels in case it does not receive scanning signal $V_{scan}$. The IR unit 32 comprises infrared emitting region 26 and infrared sensitive region 28. The infrared emitting region 26 is coupled to the supply voltage signal $V_{dd}$ to emit infrared ray; the infrared sensitive region 28 senses the infrared ray reflected from an object. The infrared sensitive 28 can be either a silicon rich sensor, a P-I-N sensor, or an a-Si TFT sensor.

The OLED display 10 according to the present embodiment has two modes of operation with different brightness of ambient light. When an object (e.g., a finger, a touch pad pencil, etc.) contacts one pixel unit 30 under conditions of higher ambient light, the brightness that sensed by the touched the pixel unit 30 is lower than that sensed by the pixel units 30. The OLED display 10 concludes that the pixel unit 30 that senses lower brightness is touched while the other pixel units 30 that sense higher brightness are untouched. When the OLED display 10 operates in a dim environment, the supply voltage signal $V_{dd}$ is activated to enable the infrared emitting region 26 to emit infrared rays and the infrared sensitive region 28 to sense the reflected infrared rays. If the infrared sensitive region 28 does not sense infrared rays, it means that the IR unit 32 is not touched. In other words, if the infrared sensitive region 28 senses infrared rays, it means that the IR unit 32 is touched. Finally, the processing unit 18 determines the position of an object corresponding to the IR unit 32 based on the infrared rays sensed by the infrared sensitive region 28. Preferably, the detection unit 15 detects brightness of ambient light. Under conditions of dim environment, the detection unit 15 controls the supply voltage signal $V_{dd}$ to conduct the infrared emitting region 26 to generate infrared rays; on the contrary, under conditions of stronger ambient light, the supply voltage signal $V_{dd}$ does not conduct the infrared emitting region 26, so that infrared rays will not be generated. In this way, power consumption can be lessened. Because human eyes cannot identify infrared rays, so under conditions of darker light the infrared rays generated by the infrared emitting region 26 cannot affect the contrast of the original pixels. Therefore, even if images around the touch zone are at lower gray level (e.g., black), such a problem that lack of light quantity of pixels leads to impossibility of sense when the images are attempted to be dragged as shown in Prior Art will not occur.

Figure 3A:
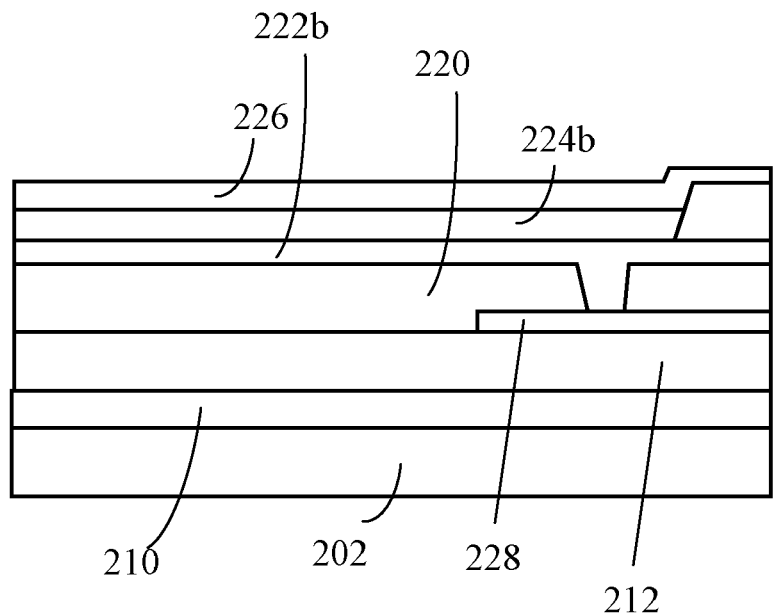
FIG. 3A is a cross-sectional view of the infrared emitting region in FIG. 2B.
Figure 3B:
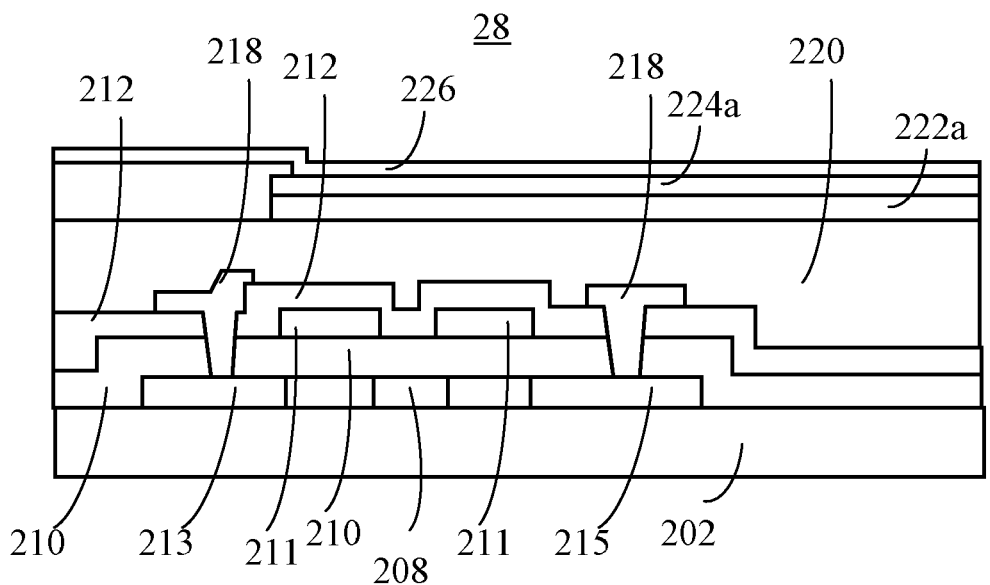
FIG. 3B is a cross-sectional view of the infrared sensitive region in FIG. 2C.

Referring to FIGS. 3A and 3B, FIG. 3A is a cross-sectional view of the infrared emitting region 26 in FIG. 2B, and FIG. 3B is a cross-sectional view of the infrared sensitive region 28 in FIG. 2C. As shown in FIG. 3A, a layer of a-Si thin film (not shown) is deposited on a glass substrate 202. Via an annealing process, the a-Si thin film layer is recrystallized to form polysilicon thin film (not shown). Afterwards, a photo engraving process (PEP) is performed for a-Si thin film, and a pattern of a required semiconductor layer 208 is produced then. A gate insulating film 210 is deposited on the semiconductor layer 208. Subsequently, a metallic thin film deposition process is performed to form a layer of metallic thin film (not shown) on the surface of the gate insulating film 210, and a PEP is performed to form a gate metal 211 by etching. Afterwards, the gate metal 211 can be employed to be a self-aligning mask to perform a boron ion implantation process for the semiconductor layer 208 to form a source 213 and a drain 215. It is noted that, the transistor 22 comprises the source 213, the drain 215, and the gate metal 211.

Next, an inter-layer dielectric (ILD) 212 is deposited, covering the gate metal 211 and the gate insulating film 210. Subsequently, a PEP is performed to remove part of the ILD 212 and the gate insulating film 210 on top of the source 213 and the drain 215 until a plurality of contact holes are formed on the drain 215 and the source 213.

Next, another metallic thin film deposition process and PEP are performed to form a power-electrode metallic layer 228 in the infrared emitting region 26 and metallic layers 218 serving as signal line and source/drain metal in the contact holes to electrically connect the source 213 and the drain 215 in the infrared sensitive region 28, respectively. Subsequently, a planarization layer 220 is deposited on the power-electrode metallic layer 228, the metallic layers 218 and the ILDs 212; a PEP is performed to remove part of the planarization layer 220 on top of the metallic layers 218 of the electrically-connected drain 215 and the power-electrode metallic layer 228; contact holes are produced on the metallic layers 218 and the power-electrode metallic layer 228.

Next, a transparent conductive film of indium tin oxide (ITO) (not shown) is formed on the planarization layer 220, and a PEP is performed to define the proper pattern of display anodes 222a and 222b. Subsequently, an organic layer 224a and an infrared emitting layer 224b are formed on the surface of the display anodes 222a and 222b, respectively. In is notified that, both of the organic layer 224a and the infrared emitting layer 224b are made of organic light emitting materials, so during the whole process, it only requires to further form the infrared emitting layer 224b, in addition to form the organic layer 224a. Therefore, it is highly complied with the original process. Besides, the display anodes 222a and 222b are not connected to each other, neither are the organic layer 224a and the infrared emitting layer 224b. Finally, a cathode metal layer 226 is formed on the organic layer 224a and the infrared emitting layer 224b, and thus the OLED panel 12 is finished manufacturing. The display anodes 222a can receive data signals from the transistor 22, and the organic light emitting diode 24 determines gray levels of light based on the data signals of the display anodes 222a and the second supply voltage signals Vss coupled by the cathode metal layer 226. The power-electrode metallic layer 228 can receive supply voltage signals $V_{dd}$ and transmit them to the display anodes 222b; the infrared emitting layer 224b emits infrared rays depending on the supply voltage signals $V_{dd}$ of the display anodes 222b and the second supply voltage signals Vss coupled by the cathode metal layer 226.

Figure 4:
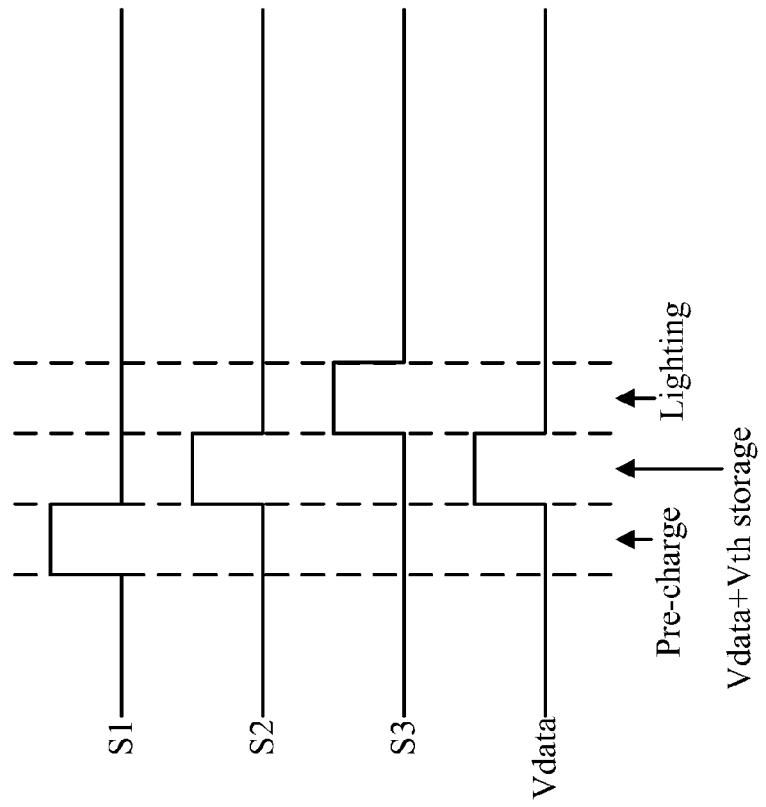
FIG. 4 illustrates an equivalent circuit diagram of the pixel unit 30 in FIG. 1 according to a second embodiment of the present invention.
Figure 5:
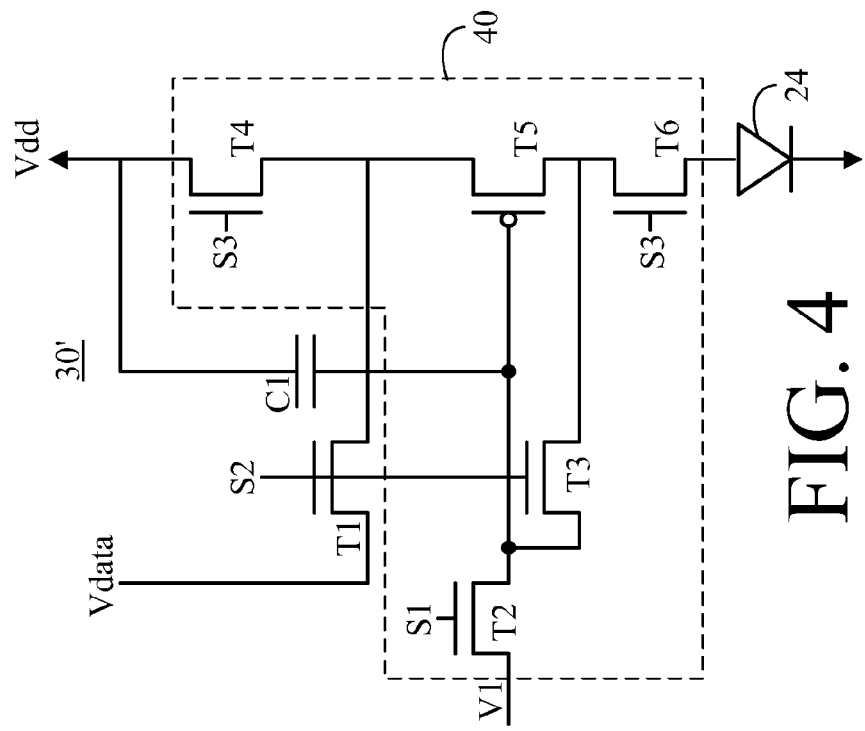
FIG. 5 shows a timing diagram of the first enabling signal, the second enabling signal, the third enabling signal and the data signal of FIG. 4.

Referring to FIGS. 4 and 5, FIG. 4 illustrates an equivalent circuit diagram of the pixel unit 30' according to a second embodiment of the present invention, and FIG. 5 shows a timing diagram of a first enabling signal S1, a second enabling signal S2, a third enabling signal S3 and the data signal $V_{data}$ of FIG. 4. In the second embodiment, the OLED panel includes a plurality of pixel units 30', which represents the three primary colors—red, green, and blue (RGB)—respectively, and a plurality of IR units 32. The pixel unit 30' comprises a first transistor T1, an organic light emitting diode 24, a storage capacitor C1, and a driving circuit 40. The driving circuit 40 comprises a second transistor T2, a third transistor T3, a fourth transistor T4, a fifth transistor T5, and a sixth transistor T6. The second transistor T2 is coupled to the storage capacitor C1. The third transistor T3 is coupled to the second transistor T2 and the storage capacitor C1, and is controlled by a second enabling signal S2. The fourth transistor T4 is coupled to the storage capacitor C1 and is controlled by a third enabling signal S3. The fifth transistor T5 is coupled to the second transistor T2 and the fourth transistor T4. The sixth transistor T6 is coupled to the fifth transistor T5 and the organic light emitting diode 24, and is controlled by the third enabling signal S3. The second transistor T2 is turned on in response to the first enabling signal S1 to deliver a compensating voltage V1 to charge the storage capacitor C1. Then, the first transistor T1 and the third transistor T3 receives second enabling signals S2 from the gate driver 14, and then conducts data signals $V_{data}$ from the source driver 16 to the storage capacitor C1. In this moment, the storage capacitor C1 stores an amount of $V_{dd}+V_{th}$, where $V_{th}$ represents a threshold voltage of the transistor T5. Afterwards, the fourth and sixth transistors T4 and T6 turn on in response to the third enabling signal S3. Meanwhile, the second transistor T2 produces current based on voltage difference between the first supply voltage signal $V_{dd}$ and the data signal Vdata. The organic light emitting diode 24 emits the three primary colors of light (red, green, and blue) depending upon the current flowing through the second transistor T2, and then adjusts the proportion of the three primary colors of light to produce different gray levels based on data signals Vdata.

In contrast to prior art, each cell of the organic light emitting diode (OLED) display of the present invention integrates an infrared emitting layer, which is made of organic light emitting diodes, with an infrared sensitive layer. So, even under conditions of dim environment, it is still allowed to sense the position coordinate of a touched pixel through the amount of infrared rays. Even if images which surround the zone that needs touching are at lower gray level, such a problem that lack of light quantity of pixels leads to being unable to sense will not occur.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:
1. An organic light emitting diode display, comprising:
  a gate driver for providing a plurality of scanning signals;
  a source driver for providing a plurality of data signals;
  a plurality of pixel units arranged in an array, each pixel unit comprising:
    a first transistor for delivering the data signal when receiving the scanning signal;
    a driving circuit coupled to the first transistor for generating a driving current based on a voltage difference between a first supply voltage signal and the data signal;
    a storage capacitor coupled to the driving circuit, for storing the data signal;
    an organic light emitting diode for generating light based on the driving current;
  a plurality of infrared units, each infrared unit comprising:
    an infrared emitting region for producing infrared ray in response to the first supply voltage signal, comprising:
      a power-electrode metallic layer for conducting the first supply voltage signal;
      a display anode disposed on the power-electrode metallic layer;
      an infrared emitting layer disposed on the display anode; and
      a cathode metal layer disposed over the infrared emitting layer; and
    an infrared sensitive region for sensing the infrared ray reflected by an object.
2. The organic light emitting diode display as claimed in claim 1 further comprising a processing unit for determining a position which the object contacts the pixel units based on the infrared ray sensed by the infrared sensitive region.
3. The organic light emitting diode display as claimed in claim 1 further comprising a detection unit for enabling the first supply voltage signal when brightness of ambient light is lower than a threshold.

4. The organic light emitting diode display as claimed in claim 1, wherein the infrared emitting layer is made of a material of organic light emitting diode.

5. The organic light emitting diode display as claimed in claim 1, wherein the driving circuit comprises:
  a second transistor coupled to the storage capacitor for delivering a compensating voltage to the storage capacitor in response to a first enabling signal;
  a third transistor coupled to the second transistor and the storage capacitor, and controlled by a second enabling signal;
  a fourth transistor coupled to the storage capacitor and controlled by a third enabling signal;
  a fifth transistor coupled to the second transistor and the fourth transistor; and
  a sixth transistor coupled to the fifth transistor and the organic light emitting diode, and controlled by the third enabling signal.

6. The organic light emitting diode display as claimed in claim 5, wherein the first enabling signal is triggered prior to the second enabling signal, and the second enabling signal is triggered prior to the third enabling signal.

7. The organic light emitting diode display as claimed in claim 5, wherein the storage capacitor is coupled between the first supply voltage signal and the second transistor.

8. The organic light emitting diode display as claimed in claim 1, wherein the infrared sensitive region includes a silicon rich sensor, a P-I-N sensor, or an a-Si TFT sensor.

9. The organic light emitting diode display as claimed in claim 1, wherein the infrared sensitive region comprising:
  a second transistor;
  an anode disposed on the second transistor;
  an organic layer disposed on the anode; and
  a cathode metal layer disposed over the organic layer.

10. An organic light emitting diode display panel for use in a display, comprising:
  a substrate having a display region;
  a plurality of pixel units arranged on the display region of the substrate, each pixel unit comprising:
    a first transistor for delivering a data signal when receiving a scanning signal;
    a driving circuit for generating a driving current based on a voltage difference between a first supply voltage signal and the data signal;
    a storage capacitor coupled between the first transistor and the driving circuit for storing the data signal; and
    an organic light emitting diode for generating light based on the driving current; and
  an infrared unit arranged on the display region of the substrate, comprising:
    an infrared emitting layer for producing infrared ray; and
    an infrared sensitive layer for sensing the infrared ray reflected by an object, comprising:
      a second transistor;
      an anode disposed on the second transistor;
      an organic layer disposed on the anode; and
      a cathode metal layer disposed over the organic layer.

11. The organic light emitting diode display panel as claimed in claim 10, wherein at least six pixel units are arranged with the infrared unit.

12. The organic light emitting diode display panel as claimed in claim 10, wherein the infrared emitting layer is made of a material of the organic light emitting diode.

13. The organic light emitting diode display panel as claimed in claim 10, wherein the infrared emitting layer is used for generating the infrared ray in response to the first supply voltage signal.

14. The organic light emitting diode display panel as claimed in claim 13 wherein the first supply voltage signal enables when brightness of ambient light of the display is lower than a threshold.

15. The organic light emitting diode display panel as claimed in claim 10, wherein the driving circuit comprises:
  a second transistor coupled to the storage capacitor for delivering a compensating voltage to the storage capacitor in response to a first enabling signal;
  a third transistor coupled to the second transistor and the storage capacitor, and controlled by a second enabling signal;
  a fourth transistor coupled to the storage capacitor and controlled by a third enabling signal;
  a fifth transistor coupled to the second transistor and the fourth transistor; and
  a sixth transistor coupled to the fifth transistor and the organic light emitting diode, and controlled by the third enabling signal.

16. The organic light emitting diode display panel as claimed in claim 15, wherein the first enabling signal is triggered prior to the second enabling signal, and the second enabling signal is triggered prior to the third enabling signal.

17. The organic light emitting diode display panel as claimed in claim 15, wherein the storage capacitor is coupled between the first supply voltage signal and the second transistor.

18. The organic light emitting diode display panel as claimed in claim 10, wherein the infrared sensitive region includes a silicon rich sensor, a P-I-N sensor, or an a-Si TFT sensor.

* * * * *